(12) United States Patent
Zhao et al.

(10) Patent No.: US 10,503,000 B2
(45) Date of Patent: Dec. 10, 2019

(54) DISPLAY PANEL AND DISPLAY DEVICE

(71) Applicants: BOE Technology Group Co., Ltd., Beijing (CN); Beijing BOE Optoelectronics Technology Co., Ltd., Beijing (CN)

(72) Inventors: Wenqing Zhao, Beijing (CN); Xiaochuan Chen, Beijing (CN); Jian Gao, Beijing (CN); Qian Wang, Beijing (CN); Pengcheng Lu, Beijing (CN); Ming Yang, Beijing (CN); Rui Xu, Beijing (CN); Lei Wang, Beijing (CN); Xiaochen Niu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 145 days.

(21) Appl. No.: 15/507,600

(22) PCT Filed: Sep. 7, 2016

(86) PCT No.: PCT/CN2016/098346
§ 371 (c)(1),
(2) Date: Feb. 28, 2017

(87) PCT Pub. No.: WO2017/118069
PCT Pub. Date: Jul. 13, 2017

(65) Prior Publication Data
US 2018/0149909 A1    May 31, 2018

(30) Foreign Application Priority Data
Jan. 8, 2016  (CN) .......................... 2016 1 0011470

(51) Int. Cl.
*G02F 1/1335*   (2006.01)
*H01L 27/32*   (2006.01)
*H01L 51/52*   (2006.01)

(52) U.S. Cl.
CPC .. *G02F 1/133504* (2013.01); *G02F 1/133512* (2013.01); *H01L 27/322* (2013.01);
(Continued)

(58) Field of Classification Search
None
See application file for complete search history.

(56) References Cited

U.S. PATENT DOCUMENTS

2016/0054489 A1* 2/2016 Koshitouge .......... G02B 5/0236
257/98

FOREIGN PATENT DOCUMENTS

CN    1605892 A    4/2005
CN    101149445 A   3/2008
(Continued)

OTHER PUBLICATIONS

Oct. 27, 2016—(WO) International Search Report and Written Opinion Appn PCT/CN2016/098346 with English Tran.

*Primary Examiner* — Phu Vu
(74) *Attorney, Agent, or Firm* — Banner & Witcoff, Ltd.

(57) ABSTRACT

A display panel and a display device are disclosed. The display panel includes a first substrate and a second substrate which are disposed oppositely to each other, wherein a first optical film is disposed on a side of the first substrate facing away from the second substrate, a plurality of nanoscale microstructures are formed on the first optical film, and the first optical film is configured to split an incident white light into a plurality of monochromatic lights with different colors. The display panel is capable of reducing the loss of
(Continued)

light efficiency of the display device and increasing the light extraction efficiency of the display device.

19 Claims, 2 Drawing Sheets

(52) U.S. Cl.
CPC ...... *H01L 51/5268* (2013.01); *H01L 51/5275* (2013.01); *H01L 51/5284* (2013.01); *G02F 2203/34* (2013.01); *H01L 27/3244* (2013.01)

(56) References Cited

FOREIGN PATENT DOCUMENTS

| | | |
|---|---|---|
| CN | 101546003 A | 9/2009 |
| CN | 205281080 U | 6/2016 |
| CN | 205485174 U | 8/2016 |
| JP | H09318942 A | 12/1997 |
| JP | 2007011313 A | 1/2007 |

\* cited by examiner

DISPLAY PANEL AND DISPLAY DEVICE

The application is a U.S. National Phase Entry of International Application No. PCT/CN2016/098346 filed on Sep. 7, 2016, designating the United States of America and claiming priority to Chinese Patent Application No. 201610011470.7 filed on Jan. 8, 2016. The present application claims priority to and the benefit of the above-identified applications and the above-identified applications are incorporated by reference herein in their entirety.

TECHNICAL FIELD

Embodiments of the present invention relate to a field of display technology, especially relate to a display panel and a display device.

BACKGROUND

Thin film transistor liquid crystal display (TFT-LCD) has many characteristics of small size, low power consumption, no radiation, etc., and it has dominated the current flat panel display market.

The color filter is one of important components in the liquid crystal display. In the liquid crystal display, the light emitted from a backlight module is processed through the color filter, and displays a colorful picture. The color filters of the existing liquid crystal displays is made of organic pigments or dyes, and the white light is converted to three primary colors R (red), G (green) and B (blue), by using different color filters. But the transmission efficiency of lights of three primary colors emitted through the existing color filter is relatively low, and the loss of light efficiency is about 60%-70%, especially the higher color purity is, the more serious the loss of light efficiency is.

SUMMARY

An object of the present invention is to provide a display panel and a display device, which are capable of reducing the loss of light efficiency of the display device and increasing the light extraction efficiency of the display device.

In first aspect of the disclosure, it is provided a display panel which comprises: a first substrate and a second substrate which are disposed oppositely to each other, wherein a first optical film is disposed on a side of the first substrate facing away from the second substrate, a plurality of nanoscale microstructures are formed on the first optical film, and the first optical film is configured to split an incident white light into a plurality of monochromatic lights with different colors.

In second aspect of the disclosure, it is provided a display device which comprises the above display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some of embodiments of the disclosure and thus are not limitative of the disclosure.

DETAILED DESCRIPTION

Figure 1:
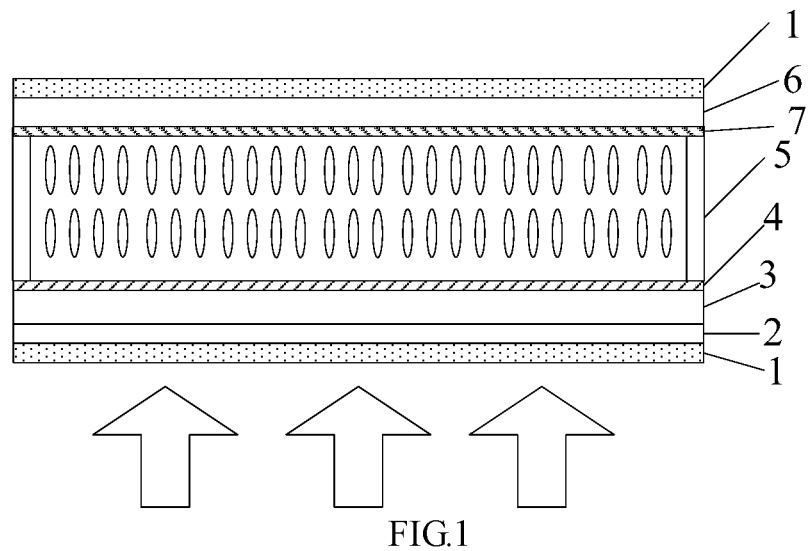
FIG. 1 schematically illustrates a display device according to an embodiment of the present invention.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The transmission efficiency of light with three primary colors emitted through the existing color filter is relatively low, and the loss of light efficiency is about 60% -70%. In order to solve the above problems, embodiments of the present invention provide a display panel and a display device, which are capable of reducing the loss of light efficiency of the display device and increasing the light extraction efficiency of the display device.

Embodiment 1

An embodiment of the present invention provides a display panel, which comprises: a first substrate and a second substrate disposed oppositely to each other, a first optical film is disposed on a side of the first substrate facing away from the second substrate, a plurality of nanoscale microstructures are formed on the first optical film, then the incident parallel light passing through the first optical film is split into a plurality of monochromatic lights with various different colors.

According to an embodiment of the present invention, a first optical film is disposed on a side of the first substrate facing away from the second substrate, a plurality of nanoscale microstructures are formed on the first optical film. When the white light passes through the nanoscale microstructures, diffraction and interference are occurred, resulting in light dispersion, and then the incident white light is split into a plurality of monochromatic lights with different colors. According to an embodiment of the present invention, a colorful display can be realized by using the first optical film instead of the color filter. In addition, a plurality of monochromatic lights with different colors are obtained by splitting the white light, not by filtering out the lights with other colors from the white light, therefore, the loss of light efficiency of the display device can be reduced, and the light extraction efficiency of the display device can be greatly increased.

In at least some of embodiments, the incident white light is parallel light.

For example, the microstructure is a groove, that is, a plurality of nanoscale grooves are formed on the first optical film, when the parallel white light passes through the nanoscale grooves, diffraction and interference are occurred, resulting in light dispersion, and then the incident white light is split into a plurality of monochromatic lights with different colors. However, the microstructure is not limited to be a groove, it may be a convex or other structure, as long as the incident white light passing through the first optical film can be split into a plurality of monochromatic lights with different colors.

For example, along the thickness direction of the substrate, a cross-section of the groove is in a shape of rectangle, taper, semi-circle, or semi-ellipse.

In at least some of embodiments, the display panel further comprises:

a black matrix pattern which comprises a plurality of hollows and are formed on a light emitting side of the first optical film, herein a monochromatic light with one color is only allowed to transmit through one of the hollows.

According to an embodiment of the present invention, a black matrix pattern is disposed on the light emitting side of the first optical film, the position of the black matrix pattern is matched with the monochromatic lights with different colors split from white light, so that a monochromatic light with one color is only allowed to pass through one of the hollows, and then a plurality of monochromatic lights with different colors are obtained by designing the black matrix pattern.

In at least some of embodiments, the black matrix pattern is disposed on a side of the first substrate facing the second substrate, such that at least the first substrate is disposed between the black matrix pattern and the first optical film, since initial divergence angles of monochromatic lights with different colors split from the white light are small, a sufficient divergence distance may be provided for a plurality of monochromatic lights by the thickness of the first substrate.

In at least some of embodiments, since visual angles of a plurality of monochromatic lights split from the white light are relatively small, the display panel further comprises:

a second optical film which is configured to enlarge divergence angles of the monochromatic lights, herein, the second optical film is disposed on a side of the black matrix pattern facing away from the first optical film, and can enlarge divergence angles of the monochromatic lights, thus the visual angle of the display device can be enlarged.

For example, the second optical film is a diffusion film or a wide visual angle film. In at least some of embodiments, the second optical film may be other optical structures capable of enlarging divergence angles of the monochromatic lights.

In at least some of embodiments, the light incident on the first optical film is parallel light; in order to ensure that the light emitting direction of the monochromatic light passing through the first optical film corresponds to a pixel electrode, the display panel further comprises:

a fourth optical film which is configured to adjust the light emitting direction of the monochromatic light and is disposed on the light emitting side of the first optical film.

The fourth optical film may be composed of a plurality of dielectric layers with different refractive index, causing a difference in refractive index at the interface, so as to adjust the emitting direction of the monochromatic light. As an example, the fourth optical film further is composed of microprisms. In at least some of embodiments, the emitting direction of the monochromatic light is controlled by groove morphology of the microstructure.

For example, the display panel is a liquid crystal display panel, and the first substrate is an array substrate or a color filter substrate.

For example, the display panel is an OLED display panel, and the first substrate is an OLED array substrate or a package substrate, a white light emitting layer is formed on the OLED array substrate, the first optical film is disposed on a light emitting side of the white light emitting layer.

In at least some of embodiments, when the display panel is an OLED display panel, the first optical film is only capable of splitting parallel white light into a plurality of monochromatic lights with different colors, so the display panel further comprises:

a third optical film disposed between the white light emitting layer and the first optical film, the third optical film is configured to convert divergent light emitted from the white light emitting layer into parallel light. For example, the third optical film is a prism film or other optical structure, as long as the divergent light can be converted into parallel light.

In at least some of embodiments, when the display panel is an OLED display panel, the display panel further comprises:

a planarization layer disposed between the first optical film and the black matrix pattern. The initial divergence angles of monochromatic lights with different colors split from the white light are small, however, since at least the planarization layer is disposed between the black matrix pattern and the first optical film, a sufficient divergence distance may be provided for a plurality of monochromatic lights by the thickness of the planarization layer.

Embodiment 2

An embodiment of the present invention provides a display device, which comprises the above display panel. The display device may be any product or component having a display function, such as a liquid crystal television, a liquid crystal display, a digital photo frame, a mobile phone, a tablet computer etc,.

In at least some of embodiments, when the display panel is a liquid crystal display panel, the first optical film is only capable of splitting parallel white light into a plurality of monochromatic lights with different colors, so the display device further comprises a backlight module which is configured to provide a parallel light source for the liquid crystal display panel.

The backlight module may directly comprise a parallel light source, or a combination of a divergent light source and a third optical film.

Embodiment 3

As illustrated in FIG. 1, according to embodiments of the present invention, the display device comprises a first substrate 3 and a second substrate 6 disposed oppositely to each other, herein, the first substrate 3 and the second substrate 6 are encapsulated by a sealant 5, a liquid crystal layer is disposed between the first substrate 3 and the second substrate 6. A polarizer 1 is attached onto both the first substrate 3 and the second substrate 6, if the incident light is a polarized light, the polarizer attached onto the first substrate 3 may be omitted.

In at least some of embodiments, the display device further comprises a backlight module which is configured to provide a parallel light source for the liquid crystal display panel. The backlight module may comprise a parallel light source, or a combination of a divergent light source and a third optical film. When the backlight module comprises a divergent light source, the light source may be a LED (Light Emitting Diode) or an OLED (Organic Light Emitting Diode), and the third optical film may be a prism film or other optical structure, as long as the divergent light emitted from the divergent light source can be converted into parallel light.

Figure 2:
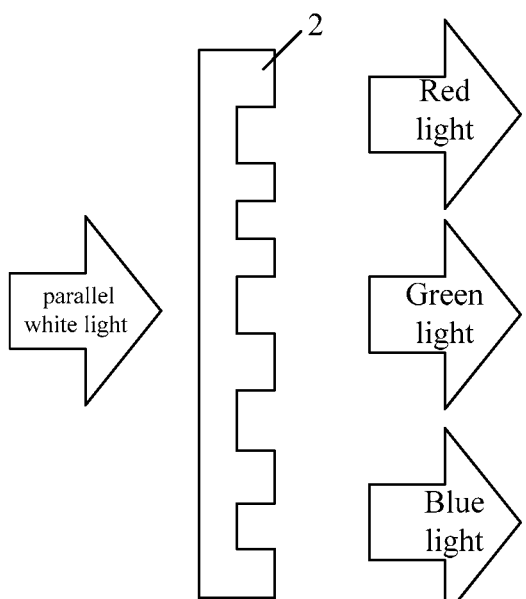
FIG. 2 schematically illustrates the white light passing through a first optical film and being split into monochromatic lights such as red light, green light, and blue light according to an embodiment of the present invention.

As illustrated in FIG. 1, a first optical film 2 is disposed on a side of the first substrate 3 facing away from the second substrate 6. The first optical film 2 may be made from a transparent insulation material, and the refractive index of the first optical film 2 may be substantially same with the first substrate 3, for example, approximately 1.5. A plurality of nanoscale microstructures are formed on the first optical film 2, then the incident parallel white light passing through the first optical film 2 can be split into a plurality of monochromatic lights with different colors. As illustrated in FIG. 2, the incident parallel white light passing through the first optical film 2 is split into monochromatic lights including red light, blue light, green light, etc.

Figure 3:
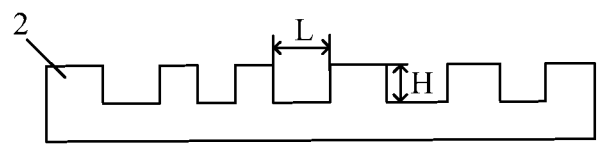
FIG. 3 schematically illustrates a first optical film according to an embodiment of the present invention.

For example, as illustrated in FIG. 3, a plurality of nanoscale grooves are formed on the first optical film 2, a cross-section of the groove taken along the thickness direction of the substrate is in a rectangular shape. In other embodiments, the cross-section of the groove taken along the thickness direction of the substrate may be in a shape of taper, semi-circle, or semi-ellipse. By designing the length L and the depth H of the groove, the incident white light passing through the first optical film 2 can be split into a plurality of desired monochromatic lights. By designing the length L and the depth H of the groove, the desired light emitting direction of light can be obtained. Additionally, the light emitting direction of light may be controlled by a refractive index difference between different dielectric layers, or may be controlled by microprisms.

Figure 4:
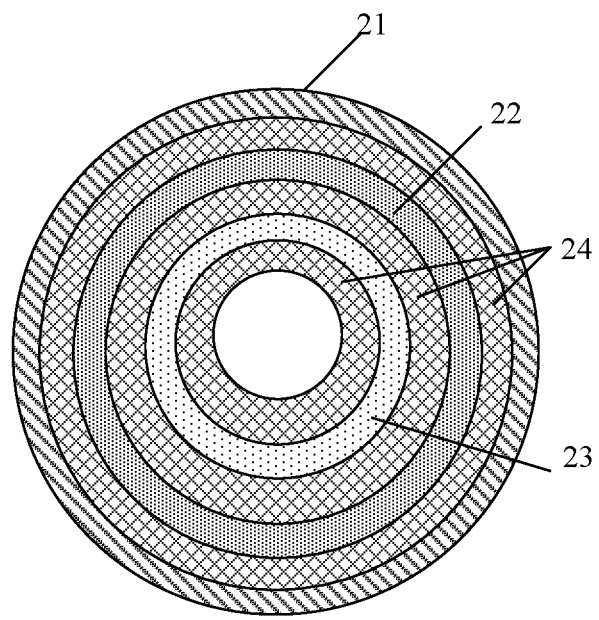
FIG. 4 schematically illustrates monochromatic lights after dispersion according to an embodiment of the present invention, the monochromatic lights, such as red light, green light and blue light, are obtained by splitting the white light passing through a first optical film, FIG. 5 schematically illustrates a display device according to another embodiment of the present invention.

FIG. 4 schematically illustrates the dispersion of monochromatic lights which are obtained by splitting white light through the first optical film 2. The numeral 21 represents red light, 22 represents green light, 23 represents blue light and 24 represents black light. It can be seen that, a wavelength distribution of lights after dispersion is continuous chromatic light, and the width of monochromatic light is not easy to be selected and used separately, it is necessary to match a black matrix pattern to correspond to the emission of pure light, thus a display device with high color gamut is obtained. In at least some of embodiments, as illustrated in FIG. 1, the display device further comprises a black matrix pattern 4 disposed on the side of the first substrate 3 facing the second substrate 6. By designing the black matrix pattern, the position of the black matrix pattern is matched with a plurality of monochromatic lights with different colors split from white light, so that a monochromatic light with one color is only allowed to pass through one of the hollows, and it is possible to emit only the desired pure light from the hollow of the black matrix pattern. For example, the extraction range of red light is from 630 nm to 780 nm, the representative wavelength is approximately 700 nm; the extraction range of green light is from 500 nm to 570 nm, the representative wavelength is approximately 550 nm; the extraction range of blue light is from 420 nm to 470 nm, the representative wavelength is approximately 470 nm.

According to an embodiment of the present invention, if the brightness of the monochromatic light with different wavelengths extracted from the black matrix pattern is not uniform, the brightness correction method would be adopted, such that the match of gray level can be realized by adjusting the pixel voltage for driving the liquid crystals.

According to an embodiment of the present invention, the black matrix pattern 4 is disposed on a side of the first substrate 3 facing the second substrate 6, such that at least a first substrate 3 is disposed between the black matrix pattern 4 and the first optical film 2, since initial divergence angles of monochromatic lights with different colors split from the white light are small, a sufficient divergence distance may be provided for a plurality of monochromatic lights by the thickness of the first substrate 3. In case that a larger divergence distance is required, a transparent insulation layer may be further disposed between the black matrix pattern 4 and the first substrate 3, and the required divergence distance can be obtained by adjusting the thickness of the transparent insulation layer, and then a desired width of monochromatic light is obtained.

In at least some of embodiments, since visual angles of a plurality of monochromatic lights split from the white light are relatively small, as illustrated in FIG. 1, the display device further comprises a second optical film 7 disposed on a side of the black matrix pattern 4 facing away from the first optical film 2. The second optical film 7 can enlarge divergence angles of the monochromatic lights, thus the visual angle of the display device can be enlarged. The second optical film 7 may be disposed on the first substrate 3 or the second substrate 6, as long as it is disposed on the side of the black matrix pattern 4 facing away from the first optical film 2. For example, the second optical film 7 may be a diffusion film or a wide visual angle film, moreover, the second optical film 7 may be other optical structures capable of enlarging divergence angles of the monochromatic lights, such as a polarizer, a liquid crystal film layer, a refractive index gradient material, a concave lens microstructure and so on, which has a function of enlarging the visual angle. Herein, the liquid crystal film layer may be a discotic liquid crystal in a fixed arrangement or other liquid crystal in a fixed arrangement.

According to an embodiment of the present invention, a first optical film is disposed on a side of the first substrate facing away from the second substrate, a plurality of nanoscale grooves are formed on the first optical film. When the white light passes through the nanoscale grooves, diffraction and interference are occurred, resulting in light dispersion, and then the incident white light is split into a plurality of monochromatic lights with different colors. According to an embodiment of the present invention, a colorful display can be realized by using the first optical film instead of the color filter. In addition, a plurality of monochromatic lights with different colors are obtained by splitting the white light, not by filtering out the lights with other colors from the white light, therefore, the loss of light efficiency of the display device can be reduced, and the light extraction efficiency of the display device can be greatly increased.

Embodiment 4

Figure 5:
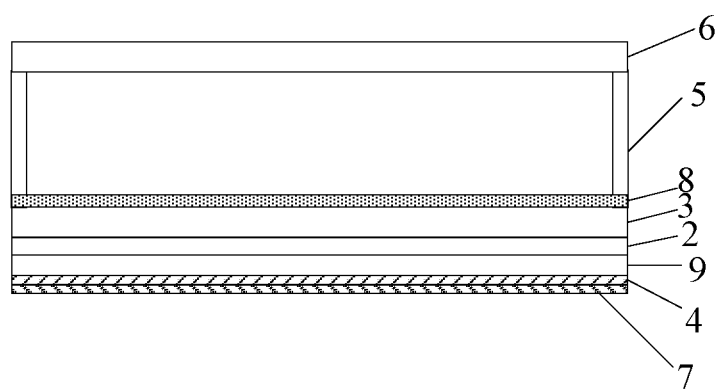

As illustrated in FIG. 5, according to embodiments of the present invention, the display device comprises a first substrate 3 and a second substrate 6 disposed oppositely to each other, herein the first substrate 3 and the second substrate 6 are encapsulated by a sealant 5, the first substrate 3 is a package substrate, the second substrate 6 is a an OLED array substrate, and a white light emitting layer is formed on the OLED array substrate. The display device further comprises a third optical film 8 disposed on a light emitting side of the white light emitting layer, the third optical film 8 is configured to convert the divergent white light emitted from the white light emitting layer into the parallel white light. For example, the third optical film may be a prism film or other optical structure, as long as the divergent light can be converted into parallel light.

As illustrated in FIG. 5, a first optical film 2 is disposed on a side of the first substrate 3 facing away from the second substrate 6, the material, structure, and function of the first optical film 2 are the same with those described in embodiment 3, and will not be elaborated here.

In at least some of embodiments, as illustrated in FIG. 5, the display device further comprises a black matrix pattern 4 disposed on a light emitting side of the first optical film 2, the structure and function of the black matrix pattern are the same with those described in embodiment 3, and will not be elaborated here.

According to embodiments of the present invention, a planarization layer 9 is disposed between the first optical film 2 and the black matrix pattern 4. Since initial divergence angles of monochromatic lights with different colors split from the white light are relatively small, a sufficient divergence distance may be provided for a plurality of monochromatic lights by the thickness of the planarization layer 9, it is possible that the desired divergence distance is achieved by adjusting the thickness of the planarization layer 9, and then the desired width of monochromatic light is obtained.

In at least embodiments, since visual angles of a plurality of monochromatic lights split from the white light are relatively small, as illustrated in FIG. 5, the display device further comprises a second optical film 7 disposed on a side of the black matrix pattern 4 facing away from the first optical film 2, the second optical film 7 is configured to enlarge divergence angles of the monochromatic lights, thus the visual angle of the display device can be enlarged. For example, the second optical film 7 is a diffusion film or a wide visual angle film, in at least some of embodiments, the second optical film 7 may be other optical structures capable of enlarging divergence angles of the monochromatic lights, such as a polarizer, a liquid crystal film layer, a refractive index gradient material, a concave lens microstructure and so on, which has a function of enlarging the visual angle. Herein, the liquid crystal film layer may be a discotic liquid crystal in a fixed arrangement or other liquid crystal in a fixed arrangement.

According to an embodiment of the present invention, a first optical film is disposed on a side of the first substrate facing away from the second substrate, a plurality of nanoscale grooves are formed on the first optical film, when the white light passes through the nanoscale grooves, diffraction and interference are occurred, resulting in light dispersion, and then the incident white light is split into a plurality of monochromatic lights with different colors. According to an embodiment of the present invention, a color display can be realized by using the first optical film instead of the color filter. In addition, a plurality of monochromatic lights with different colors are obtained by splitting the white light, not by filtering out the lights with other colors from the white light, therefore, the loss of light efficiency of the display device can be reduced, and the light extraction efficiency of the display device can be greatly increased.

What is described above is related to the illustrative embodiments of the disclosure only and not limitative to the scope of the disclosure; the scopes of the disclosure are defined by the accompanying claims.

The present application claims the priority of Chinese patent application No. 201610011470.7 filed on Jan. 8, 2016, the disclosure of which is hereby incorporated by reference herein in its entirety.

The invention claimed is:

1. A display panel, comprising:
   a first substrate;
   a second substrate, disposed oppositely to the first substrate;
   a first optical film, disposed on a side of the first substrate facing away from the second substrate, and configured to be in contact with the first substrate and split a parallel incident white light into a plurality of monochromatic lights with different colors, the first optical film comprising a plurality of nanoscale grooves formed in the first optical film; and
   a black matrix pattern, disposed on a side of the first substrate facing towards the second substrate and configured to be in contact with the first substrate.

2. The display panel according to claim 1, wherein a cross-section of the groove is in a shape of rectangle, taper, semi-circle or semi-ellipse.

3. The display panel according to claim 1,
   wherein the black matrix pattern comprises a plurality of hollows and is formed on a light emitting side of the first optical film, wherein a monochromatic light with one color is allowed to transmit one of the hollows.

4. The display panel according to claim 3, further comprising:
   a second optical film, which is configured to enlarge divergence angles of the monochromatic lights, wherein the second optical film is disposed on a side of the black matrix pattern facing away from the first optical film.

5. The display panel according to claim 4, wherein the second optical film is a diffusion film or a wide visual angle film.

6. The display panel according to claim 1, further comprising:
   a fourth optical film which is configured to adjust a light emitting direction of the monochromatic lights, wherein the fourth optical film is disposed on a light emitting side of the first optical film.

7. The display panel according to claim 1, wherein the display panel is a liquid crystal display panel.

8. The display panel according to claim 1, wherein the display panel is an OLED display panel, the first substrate is an OLED array substrate or a package substrate, a white light emitting layer is formed on the OLED array substrate, the first optical film is disposed on a light emitting side of the white light emitting layer.

9. The display panel according to claim 8, further comprising:
   a third optical film disposed between the white light emitting layer and the first optical film, wherein the third optical film is configured to convert divergent light emitted from the white light emitting layer into parallel light.

10. The display panel according to claim 8, further comprising:
a planarization layer disposed between the first optical film and the black matrix pattern.

11. A display device, comprising: the display panel according to claim 1.

12. The display device according to claim 11, wherein the display panel is a liquid crystal display panel, and the display device further comprises a backlight module which is configured to provide a parallel light source for the liquid crystal display panel.

13. The display panel according to claim 1, wherein the display panel is an OLED display panel, the first substrate is an OLED array substrate or a package substrate, a white light emitting layer is formed on the OLED array substrate, the first optical film is disposed on a light emitting side of the white light emitting layer.

14. The display panel according to claim 2, wherein the display panel is an OLED display panel, the first substrate is an OLED array substrate or a package substrate, a white light emitting layer is formed on the OLED array substrate, the first optical film is disposed on a light emitting side of the white light emitting layer.

15. The display panel according to claim 3, wherein the display panel is an OLED display panel, the first substrate is an OLED array substrate or a package substrate, a white light emitting layer is formed on the OLED array substrate, the first optical film is disposed on a light emitting side of the white light emitting layer.

16. The display panel according to claim 4, wherein the display panel is an OLED display panel, the first substrate is an OLED array substrate or a package substrate, a white light emitting layer is formed on the OLED array substrate, the first optical film is disposed on a light emitting side of the white light emitting layer.

17. The display panel according to claim 5, wherein the display panel is an OLED display panel, the first substrate is an OLED array substrate or a package substrate, a white light emitting layer is formed on the OLED array substrate, the first optical film is disposed on a light emitting side of the white light emitting layer.

18. A display panel, comprising:
a first substrate;
a second substrate, disposed oppositely to the first substrate;
a liquid crystal layer, disposed between the first substrate and the second substrate;
a first optical film, disposed on a side of the first substrate opposite to the liquid crystal layer, the first optical film comprising a plurality of nanoscale grooves and being configured to split a white light incident on the first optical film into a plurality of monochromatic lights with different colors; and
a black matrix pattern, disposed between the first substrate and the liquid crystal layer,
wherein the first optical film and the black matrix patter are located on a same side of the liquid crystal layer.

19. The display panel according to claim 18, wherein the first optical film is configured to be in contact with the first substrate, and the black matrix pattern is configured to be in contact with the first substrate.

* * * * *